| United States Patent [19] | [11] Patent Number: 4,731,116 |
|---|---|
| Kny | [45] Date of Patent: Mar. 15, 1988 |

[54] SPUTTER TARGET AND PROCESS FOR PRODUCING SPUTTER TARGET

[75] Inventor: Erich Kny, Pflach, Austria

[73] Assignee: Schwarzkopf Development Corporation, New York, N.Y.

[21] Appl. No.: 943,930

[22] Filed: Dec. 18, 1986

[30] Foreign Application Priority Data

Dec. 23, 1985 [AT] Austria ................................. 3723/85

[51] Int. Cl.$^4$ .............................................. G22C 29/04
[52] U.S. Cl. ....................................... 75/238; 75/236; 75/239; 75/240; 75/242; 75/244; 204/291; 204/292; 419/2; 419/12; 419/13; 419/15; 419/16; 419/17; 419/18; 419/26; 419/28; 419/38; 419/44; 419/66
[58] Field of Search .................... 419/2, 66, 26, 28, 12, 419/13, 14, 15, 16, 17, 18, 38, 44; 75/238, 236, 244, 239, 240, 241, 242; 204/291, 292

[56] References Cited

U.S. PATENT DOCUMENTS 4,331,476 5/1982 Helderman et al. ................... 75/248
4,619,695 10/1986 Oikawa et al. ......................... 419/29
4,619,697 10/1986 Hijkata et al. ......................... 75/230
4,636,253 1/1987 Nakai et al. ............................ 419/26

*Primary Examiner*—Stephen J. Lechert, Jr.
*Attorney, Agent, or Firm*—Morgan & Finnegan

[57] ABSTRACT

Sputter targets and a process for producing sputter targets are provided, comprised of carbides and/or nitrides and/or borides of refractory metals. In a first step, a dense composite body is produced comprised of one or more carbides and/or nitrides and/or borides of the metals of Groups IV A–VI A of the periodic table and a metallic binding agent comprised of one or more metals of the iron group of the periodic table. This composite body in the form of a shaped blank is machined, if necessary, and the binding agent is removed by chemical or electrochemical treatment. The sputter target as so produced has excellent mechanical strength and high thermal shock resistance. Levels of contaminating elements and the residual metallic binding agent are extremely low, meeting the requirements typically placed on sputter targets.

9 Claims, No Drawings

SPUTTER TARGET AND PROCESS FOR PRODUCING SPUTTER TARGET

BACKGROUND OF THE INVENTION

The present invention relates to sputter targets made of carbides and/or nitrides and/or borides of refractory metals and a process for producing sputter targets.

Sputtering, the technique of coating diverse metallic and non-metallic shaped parts by evaporating targets (sputter targets) in cathodic evaporating units has gained rapidly in importance in recent years and is continuing to grow. In the past, sputter targets of carbides and/or nitrides and/or borides of the refractory metals have been produced by pressing and sintering, or by hot pressing powdered carbides, nitrides, borides or mixtures thereof. The required sintering temperatures, or hot pressing temperatures, of such processes are very high, generally in the order of about 2000° C. The shaped parts of these earlier processes generally have poor mechanical strength, are generally difficult to machine and have a tendency of forming cracks. As a result, they have low thermal shock resistance. Materials with these properties are of very limited use as sputter targets. Thus, targets of this type have found little commercial application.

SUMMARY OF THE INVENTION

According to the present invention, a process is provided for producing sputter targets made of carbides and/or nitrides and/or borides of refractory metals which avoid, or substantially avoid, the disadvantages mentioned above.

A product and process are provided as follows: First, a dense composite body is produced from (1) one or more carbides and/or nitrides and/or borides of the refractory metals of Group IV A–VI A of the periodic tables of the elements, and (2) a metallic binding agent of one or more metals of the iron group of the periodic table. The dense composite body is produced by powder metallurgy methods such as by pressing and/or sintering. The shaped target body can then be machined, either before and/or after sintering, and finally the binding agent is removed from the target by chemical or electrochemical treatment.

DETAILED DESCRIPTION OF THE INVENTION

The shaped sputter targets of the invention are produced by processes, such as pressing and/or sintering a powder blend of carbides and/or nitrides and/or borides of refractory metals having a powdered metal binding agent incorporated therewith. The binding agents can be cobalt, iron, nickel or blends of such metals and the like, or mixtures thereof.

Advantageously, the process of the invention provides for use of much lower sintering temperatures of about 1500° C., as compared to the earlier production processes. In cases where machining of the sputter targets is necessary, the sintered shaped parts can be produced in final form, or nearly final form, prior to removing the binding agent. In this manner, the sputter targets can be more easily machined. After machining, the metallic binding agent can be removed completely, or almost completely, by chemical or electrochemical treatment such as by etching.

Surprisingly, even after removing the binding agent, the sputter targets of the invention have excellent mechanical strength and high thermal shock resistance. These properties are very important for sputter targets and are considerably higher than the values for sputter targets produced by earlier processes. The binding agents can be removed from the target completely or almost completely by chemical and/or electrochemical treatment. The level of contaminating elements, such as oxygen, nitrogen and the like and the residual binding agent, in the sputter targets of the invention are extremely low and meet the general requirements for sputter targets.

Table 1 below shows of contaminant levels and the bending strength values of various tungsten carbide sputter targets produced by the process of the invention, starting with different base materials.

TABLE 1

| Contaminant Levels and Bending Strength of Sputter Targets Produced According to the Invention | | | | | |
|---|---|---|---|---|---|
| Base Material (% by weight) | | $O_2$ ppm | $N_2$ ppm | Residual Co (% by weight) | Bending Strength (N/mm$^2$) |
| 6% Co 0.3% TaC | Remainder WC | 250 | 53 | .04 | not measured |
| 9% Co 0.6% TaC | 0.2% TiC Remainder WC | 780 | 12 | .04 | not measured |
| 9% Co 10% TaNbC | 4% TiC Remainder WC | 1200 | 1100 | .05 | 475 |
| 6% Co 5.5% TaNbC | 5% TiC Remainder WC | 1020 | 500 | .08 | 614 |
| 6% Co | Remainder WC | 175 | — | .03 | 395 |

The invention is described in more detail in the following example.

EXAMPLE 1

Disk-shaped sputter targets of tungsten carbide having a final diameter of 75 mm and a thickness of 6 mm are produced in the following manner.

0.3 kg of a cobalt powder with an average grain size of 1.3 um was blended with 4.7 kg tungsten carbide powder having an average grain size of 5.5 um. The total carbon content is adjusted to 5.83% by adding powdered carbon black. This powder mixture is ground for 120 hours in a ball mill in the presence of tungsten carbide balls and acetone as a grinding fluid. After the grinding process is completed, the acetone is removed by distillation. The powder blend obtained in this manner is pressed into a cylindrical blank by an isostatic pressing method at a pressure of 1000 bar. Disks are cut from the cylindrical blank and reduced to a dimension such that a shrinkage of 45% in volume that occurs in sintering is taken into account. The disk-shaped pieces are obtained after sintering which are slightly over-dimensioned with respect to the required final dimensions of the sputter target. Following machining, the disk-shaped pieces are sintered in a vacuum at 1480° C. for one hour. The sintered disk-shaped piece is then reduced to the desired final dimensions by grinding using a diamond grinding wheel. Subsequently, the disk-shaped hard-metal piece is treated for approximately 168 hours in boiling, semi-concentrated hydrochloric acid to dissolve the cobalt binding agent. To remove the residual hydrochloric acid, the disk-shaped sputter target is first treated with distilled water at 100° C. and then dried for 24 hours at 120° C. As a check on whether the cobalt binding agent is removed from the sputter targets, the difference in weight of the sputter targets prior to the hyrochloric acid treatment and after the treatment is measured. Another means of checking for whether the cobalt is removed from the sputter target is magnetic saturation, which is zero if there is no cobalt present. In case any residual cobalt is found, the sputter targets are again subjected to treatment with fresh, boiling, semi-concentrated hydrochloric acid until complete or nearly complete dissolution of the cobalt binder phase is achieved.

What is claimed is:

1. A process for producing a sputter target the bulk of said sputter target comprised of carbides and/or nitrides and/or borides of a refractory metal, comprising: providing a dense composite body the bulk of which being comprised of (1) one or more carbides and/or nitrides and/or borides of the metals of Group IV A to VI A of the periodic table and (2) a metallic binding agent comprised of one or more metals of the iron group of the periodic table; densifying said composite body by pressing and/or sintering; preferably machining the densified composite body before and/or after sintering to form a shaped sputter target; and removing the binding agent by chemical and/or electrochemical treatment.

2. A process for producing a sputter target according to claim 1, wherein the composite body is comprised of one or more of carbides selected from the group consisting of tungsten carbide, titanium carbide, tantalum carbide, niobium carbide, zirconium carbide, chromium carbide, and molybdenum carbide and wherein said binding agent is comprised of one or more metals of the iron group of the periodic table.

3. A process for producing a sputter target according to claim 1, wherein the composite body is comprised of one or more of the nitrides selected from the group consisting of tungsten nitride, titanium nitride, tantalum nitride, niobium nitride, zirconium nitride, chromium nitride, and molybdenum nitride, and wherein said binding agent is comprised of one or more metals of the iron group of the periodic table.

4. A sputter target formed in accordance with the process of claim 1.

5. A process for producing a sputter target consisting essentially of carbides and/or nitrides and/or borides of a refractory metal, comprising: providing a dense composite body consisting essentially of (1) one or more carbides and/or nitrides and/or borides of the metals of Group IV A to VI A of the periodic table of the elements and (2) a metallic binding agent consisting essentially of one or more metals of the iron group of the periodic table of the elements; densifying said composite body by pressing and/or sintering; and removing the binding agent by chemical and/or electrochemical treatment.

6. A process for producing a sputter target according to claim 5 wherein the densified composite body is machined before and/or after sintering to form a shaped sputter target prior to removing the binding agent.

7. A process for producing a sputter target according to claim 5, wherein the composite body consists essentially of one or more of carbides selected from the group consisting of tungsten carbide, titanium carbide, tantalum carbide, niobium carbide, zirconium carbide, chromium carbide, and molybdenum carbide and wherein said binding agent consists essentially of one or more of the iron group of the periodic table of the elements.

8. A process for producing a sputter target according to claim 5, wherein the composite body consists essentially of one or more of the nitrides selected from the group consisting of tungsten nitride, titanium nitride, tantalum nitride, niobium nitride, zirconium nitride, chromium nitride, and molybdenum nitride, and wherein said binding agent consists essentially of one or more metals of the iron group of the periodic table of the elements.

9. A sputter target formed in accordance with the process of claim 5.

* * * * *